US008809904B2

(12) United States Patent
Zhang et al.

(10) Patent No.: US 8,809,904 B2
(45) Date of Patent: Aug. 19, 2014

(54) ELECTRONIC DEVICE STRUCTURE WITH A SEMICONDUCTOR LEDGE LAYER FOR SURFACE PASSIVATION

(75) Inventors: Qingchun Zhang, Cary, NC (US); Anant Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 131 days.

(21) Appl. No.: 12/843,113

(22) Filed: Jul. 26, 2010

(65) Prior Publication Data

US 2012/0018738 A1    Jan. 26, 2012

(51) Int. Cl.
*H01L 29/36* (2006.01)

(52) U.S. Cl.
USPC ...... 257/147; 257/77; 257/107; 257/E29.104; 257/E29.212

(58) Field of Classification Search
USPC ............. 257/77, 107, 147, E29.104; 438/133
See application file for complete search history.

(56) References Cited

U.S. PATENT DOCUMENTS

| 7,838,377 B2 | 11/2010 | Zhang et al. | |
|---|---|---|---|
| 7,863,647 B1 * | 1/2011 | Veliadis | 257/186 |
| 2007/0145378 A1 * | 6/2007 | Agarwal et al. | 257/77 |

FOREIGN PATENT DOCUMENTS

| EP | 1806787 A1 | 7/2007 |
|---|---|---|
| EP | 1973165 A1 | 9/2008 |
| WO | 2006057686 A2 | 6/2006 |
| WO | 2006135031 A2 | 12/2006 |
| WO | 2009061340 A1 | 5/2009 |

OTHER PUBLICATIONS

International Search Report mailed Oct. 7, 2011 for PCT/US2011/039342, 4 pages.
International Preliminary Report on Patentability for PCT/US11/39342, mailed Aug. 17, 2012.
Examination Report for European Patent Application No. 11725296.5, mailed Nov. 22, 2013, 5 pages.

* cited by examiner

*Primary Examiner* — Elias M Ullah
(74) *Attorney, Agent, or Firm* — Withrow & Terranova, P.L.L.C.

(57) ABSTRACT

Electronic device structures including semiconductor ledge layers for surface passivation and methods of manufacturing the same are disclosed. In one embodiment, the electronic device includes a number of semiconductor layers of a desired semiconductor material having alternating doping types. The semiconductor layers include a base layer of a first doping type that includes a highly doped well forming a first contact region of the electronic device and one or more contact layers of a second doping type on the base layer that have been etched to form a second contact region of the electronic device. The etching of the one or more contact layers causes substantial crystalline damage, and thus interface charge, on the surface of the base layer. In order to passivate the surface of the base layer, a semiconductor ledge layer of the semiconductor material is epitaxially grown on at least the surface of the base layer.

19 Claims, 12 Drawing Sheets

ELECTRONIC DEVICE STRUCTURE WITH A SEMICONDUCTOR LEDGE LAYER FOR SURFACE PASSIVATION

This invention was made with government funds under Contract No. W911NF-04-2-0022 given by Army Research Labs. The U.S. Government may have rights in this invention.

FIELD OF THE DISCLOSURE

The present disclosure relates to surface passivation for an electronic device.

BACKGROUND

Silicon Carbide (SiC) Gate Turn-Off Thyristors (GTOs) are considered to be an appropriate device for high power, high temperature, and high frequency applications. One of the major challenges in the fabrication of SiC GTOs is the phenomenon of current gain instability on the top transistor, which is partially attributed to surface recombination. More specifically, FIGS. 1A through 1C illustrate a conventional process for fabricating a GTO 10. As illustrated in FIG. 1A, fabrication of the GTO 10 begins with a structure 12 including a number of epitaxial layers 14 through 22 of a desired semiconductor material having alternating doping types. The epitaxial layers 14 through 22 may more generally be referred to herein as semiconductor layers. More specifically, the structure 12 includes an N-type epitaxial layer 14 that is highly doped, a P-type epitaxial layer 16 on the N-type epitaxial layer 14, an N-type base layer 18 epitaxially grown on the P-type epitaxial layer 16, a P-type epitaxial layer 20 that is highly doped and on the N-type base layer 18, and a P-type epitaxial layer 22 that is very highly doped and on the P-type epitaxial layer 20.

As illustrated in FIG. 1B, the P-type epitaxial layers 20 and 22 are etched down to the N-type base layer 18 such that, after etching, the P-type epitaxial layers 20 and 22 form an anode of the GTO 10. The bottom surface of the N-type epitaxial layer 14 forms a cathode of the GTO 10. As illustrated, as a result of the etching process, there is substantial damage to the crystalline structure both at sidewall surfaces 24 of the P-type epitaxial layers 20 and 22 forming the anode of the GTO 10 and at a surface 26 of the N-type base layer 18. Lastly, as illustrated in FIG. 1C, N+ wells 28 are formed in the N-type base layer 18 as illustrated via ion implantation. The N+ wells 28 form gates of the GTO 10. At this point, fabrication of the GTO 10 is complete.

During operation, when a current ($I_G$) is applied to the gates, electrons are injected into the N-type base layer 18 and travel through the N-type base layer 18 into the P-type epitaxial layers 20 and 22 forming the anode of the GTO 10. These electrons attract holes from the P-type epitaxial layers 20 and 22 forming the anode. Because the P-type epitaxial layers 20 and 22 are highly doped, a single electron injected into the N-type base layer 18 attracts multiple holes from the P-type epitaxial layers 20 and 22. As a result, holes that are attracted by the electrons injected into the N-type base layer 18 that do not combine with the electrons injected into the N-type base layer 18 flow from the anode of the GTO 10 to the cathode of the GTO 10, thereby creating a current flowing through the GTO 10.

However, the damage to the crystalline structure due to the etching process to form the anode of the GTO 10 results in interface charge, or surface traps, both at the sidewall surfaces 24 of the P-type epitaxial layers 20 and 22 and the surface 26 of the N-type base layer 18. This interface charge attracts and traps electrons injected into the N-type base layer 18 in a phenomenon referred to as surface recombination. This surface recombination decreases a gain ($\beta$) of a top transistor of the GTO 10. The top transistor of the GTO 10 is a PNP transistor formed by the epitaxial layers 16, 18, and 20. The GTO 10 also includes a bottom transistor, which is an NPN transistor formed by the epitaxial layers 14, 16, and 18. By decreasing the gain ($\beta$) of the top transistor of the GTO 10, surface recombination also increases a turn-on current ($I_{G,TURN-ON}$) required at the gate of the GTO 10 in order to turn on the GTO 10. Further, during operation, the amount of interface charge, or surface traps, increases, thereby resulting in instability in a current gain of the GTO 10 and thus the turn-on current ($I_{G,TURN-ON}$) of the GTO 10. In addition, surface recombination increases an on-resistance of the GTO 10. As such, there is a need for a GTO structure that eliminates or at least mitigates surface recombination.

SUMMARY

Electronic device structures including semiconductor ledge layers for surface passivation and methods of manufacturing the same are disclosed. In general, electronic device structures are provided for a PN junction based electronic device such as, but not limited to, a Gate Turn-Off Thyristor (GTO), a Bipolar Junction Transistor (BJT), or a MOS-Controlled Thyristor (MCT). In one embodiment, the electronic device includes a number of semiconductor layers having alternating doping types. The semiconductor layers include a base layer of a first doping type that includes a highly doped well forming a first contact region of the electronic device and one or more contact layers of a second doping type on the base layer. The one or more contact layers are etched to form a second contact region of the electronic device on a portion of the base layer. The etching of the one or more contact layers causes substantial crystalline damage, and thus interface charge, on the surface of the base layer. In order to passivate the surface of the base layer, a semiconductor ledge layer is grown on at least the surface of the base layer. In one embodiment, the semiconductor layers and the semiconductor ledge layer are formed of Silicon Carbide (SiC).

In one embodiment, the semiconductor ledge layer is lightly doped and is either of the first doping type or the second doping type. In one preferred embodiment, the semiconductor ledge layer is lightly doped and of the first doping type, which is the same doping type as the base layer. In addition, the semiconductor ledge layer may also cover at least a portion of a sidewall of the first contact region. A thickness and doping level of the semiconductor ledge layer may also be optimized to compensate for an amount of interface charge on the surface of the base layer. Preferably, the thickness of the semiconductor ledge layer is in a range of about and including 1000 to 3000 Angstroms, and the doping level of the semiconductor ledge layer is in a range of about and including $5 \times 10^{15}$ and $1 \times 10^{17}$ carrier atoms per centimeter cubed ($cm^3$).

In another embodiment, the semiconductor ledge layer is highly doped and is of the first doping type, which is the same doping type as the base layer. In this embodiment, the semiconductor ledge layer covers at least a portion of the surface of the base layer between the first contact region and the second contact region but does not cover a sidewall of the first contact region. Further, a doping level of the semiconductor ledge layer is substantially greater than a doping level of the base layer such that a doping gradient between the base layer and the semiconductor ledge layer creates an electric field that repels charge carriers injected into the base layer away from the interface charge on the surface of the base layer, thereby reducing surface recombination. As a result, a gain of the electronic device is increased, which in turn decreases a turn-on current of the electronic device. In one embodiment, the doping level of the semiconductor ledge layer is greater than or equal to about $1 \times 10^{18}$ carrier atoms per cm$^3$ and the doping level of the base layer is in the range of about and including $1 \times 10^{17}$ and $1 \times 10^{18}$ carrier atoms per cm$^3$. In one embodiment, the doping gradient is in a range of about and including $1 \times 10^5$ to $1 \times 10^8$ cm$^3$ per cm.

In another embodiment, the semiconductor ledge layer is a highly doped semiconductor ledge layer of the first doping type, which is the same doping type as the base layer, and the semiconductor layers and the highly doped semiconductor ledge layer are formed of a semiconductor material having a thermal oxidation rate on a plane corresponding to a sidewall surface of the one or more contact layers that is substantially greater than a thermal oxidation rate on a plane corresponding to the surface of the base layer. In one preferred embodiment, the semiconductor layers and the semiconductor ledge layer are formed of SiC. In this embodiment, in order to fabricate the highly doped semiconductor ledge layer, a highly doped layer of the semiconductor material is grown over the sidewall surface of the one or more contact layers and the surface of the base layer to a predetermined thickness. After growing the highly doped layer, a thermal oxidation process is performed to grow an oxide over the highly doped layer such that a portion of the highly doped layer that is on the sidewall surface of the one or more contact layers is sacrificed during the thermal oxidation process. A portion of the highly doped layer that remains on the surface of the base layer after performing the thermal oxidation process forms the highly doped semiconductor ledge layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 4A:
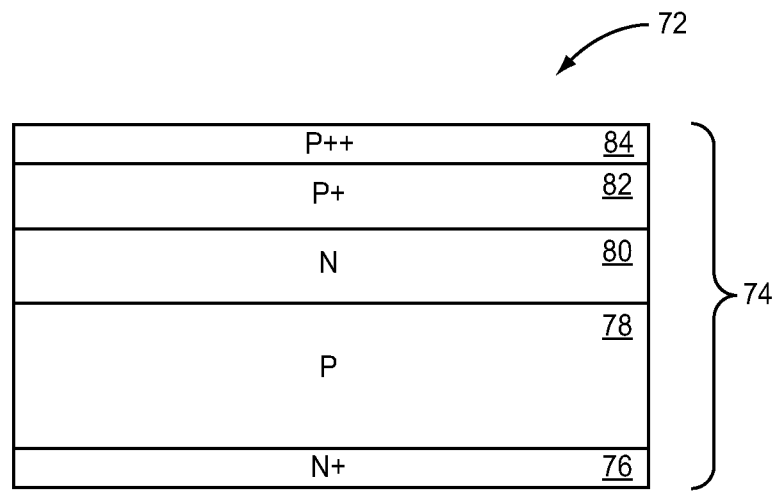
FIGS. 4A through 4G illustrate a P-type GTO and a method of fabrication thereof according to a second embodiment of the present disclosure.
Figure 4B:
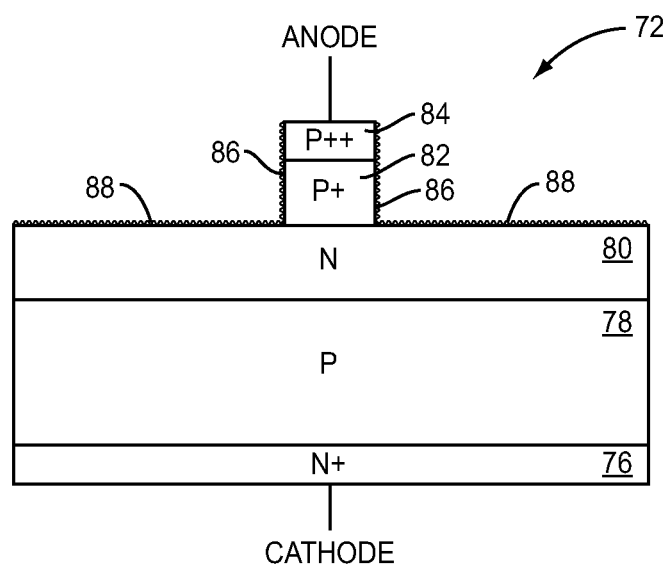
Figure 4C:
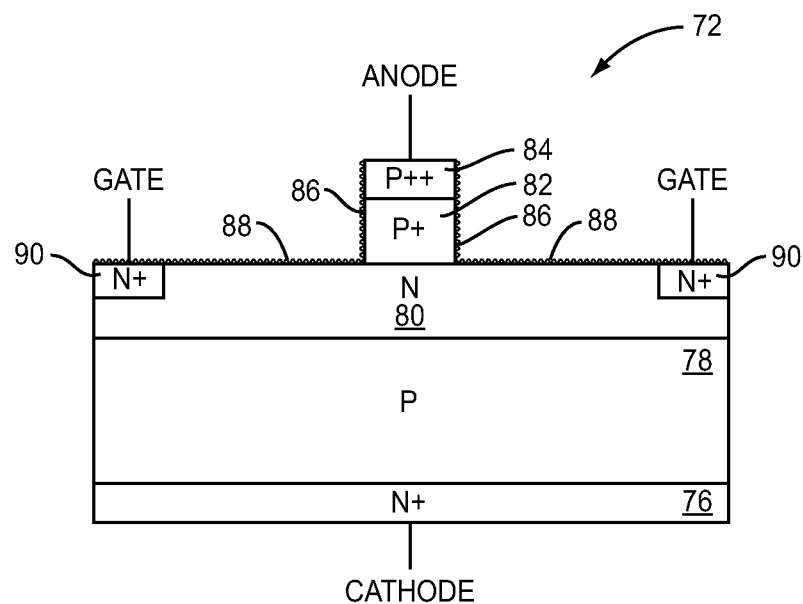
Figure 4D:
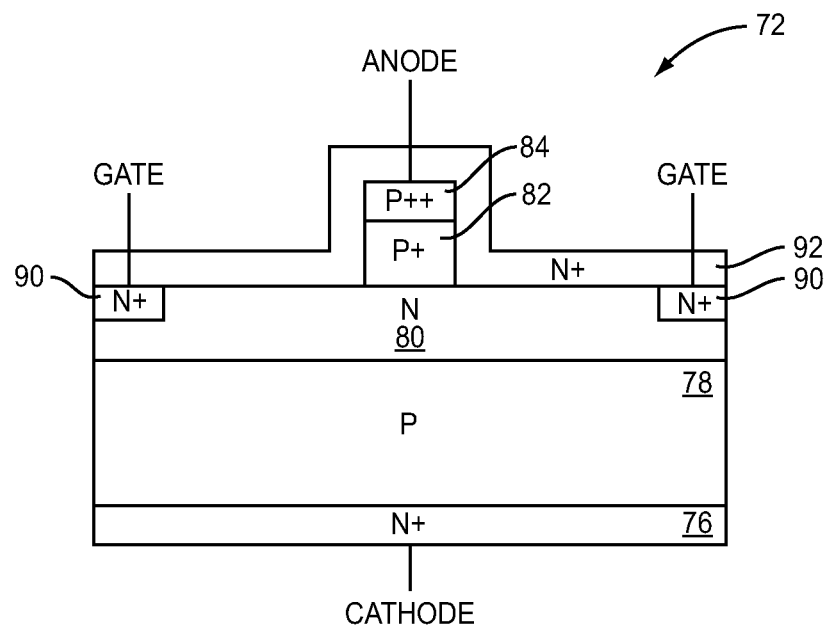
Figure 4E:
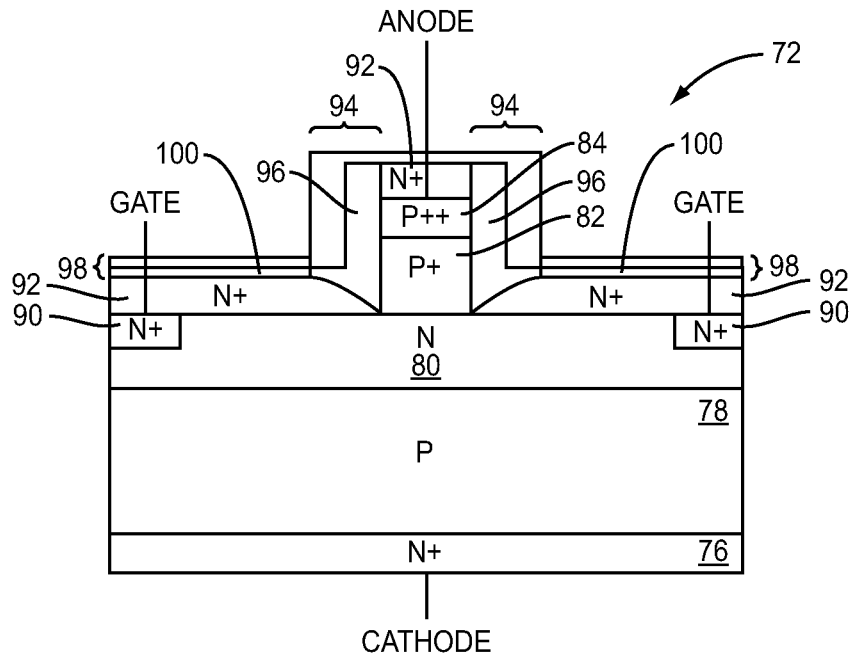
Figure 4F:
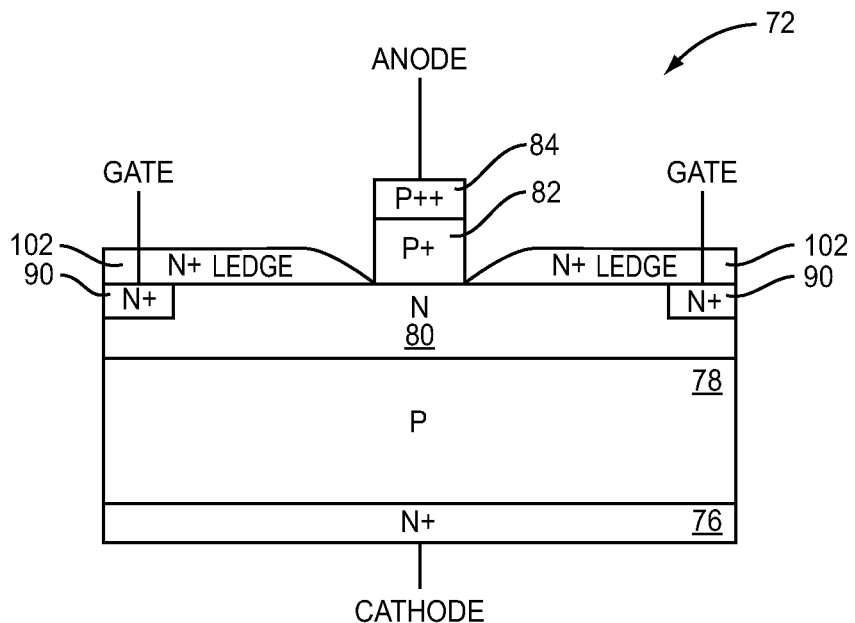
Figure 4G:
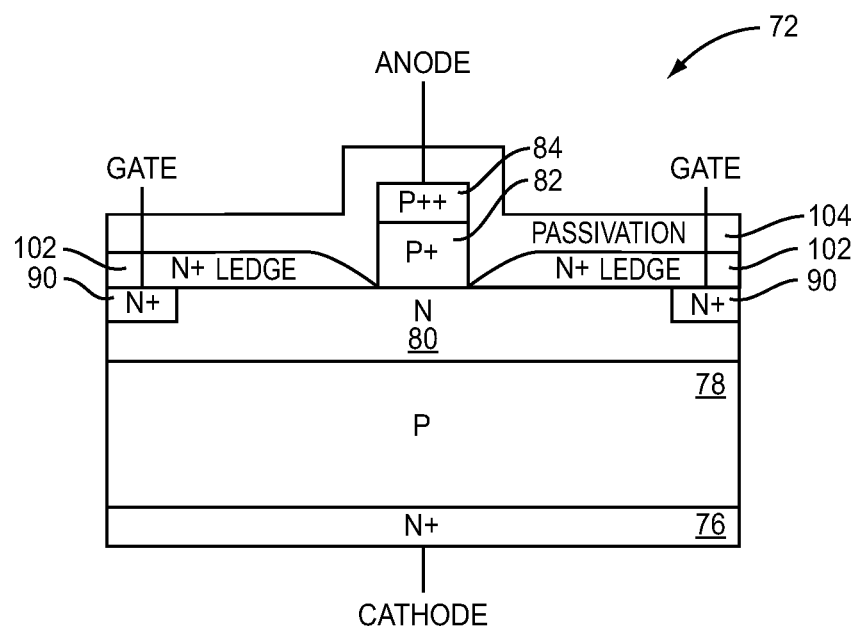
Figure 5:
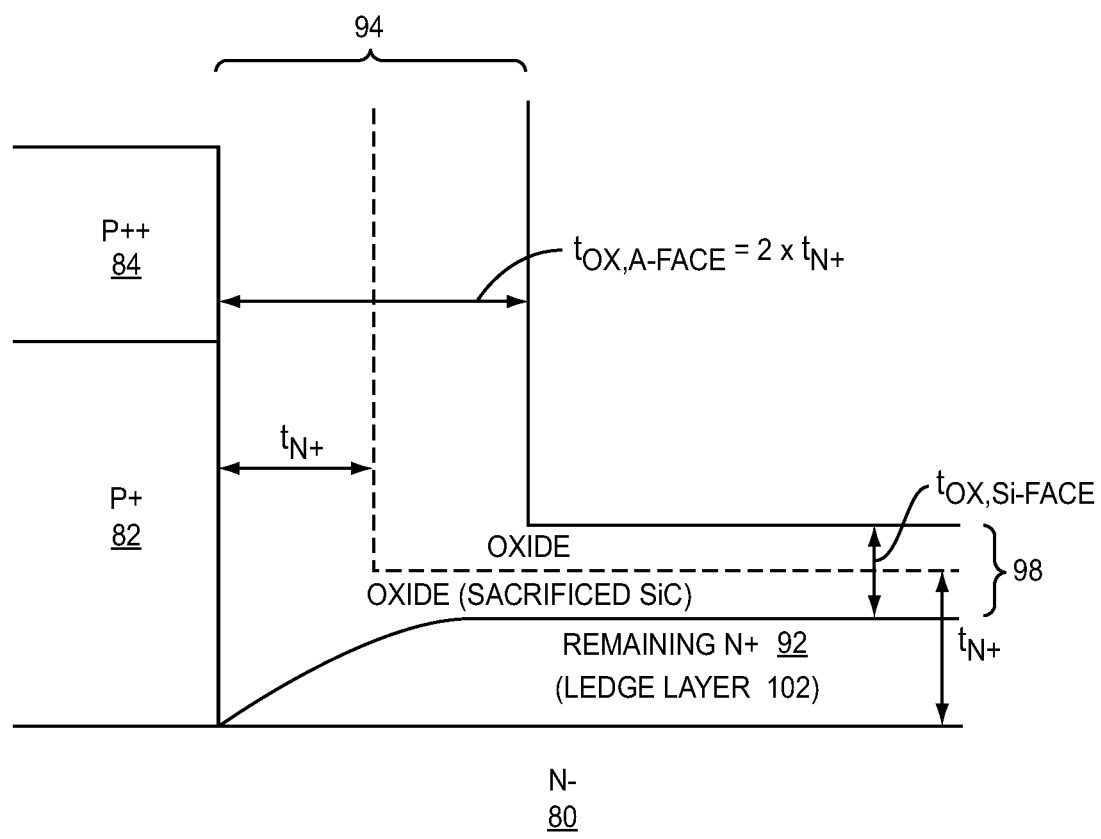
Figure 6:
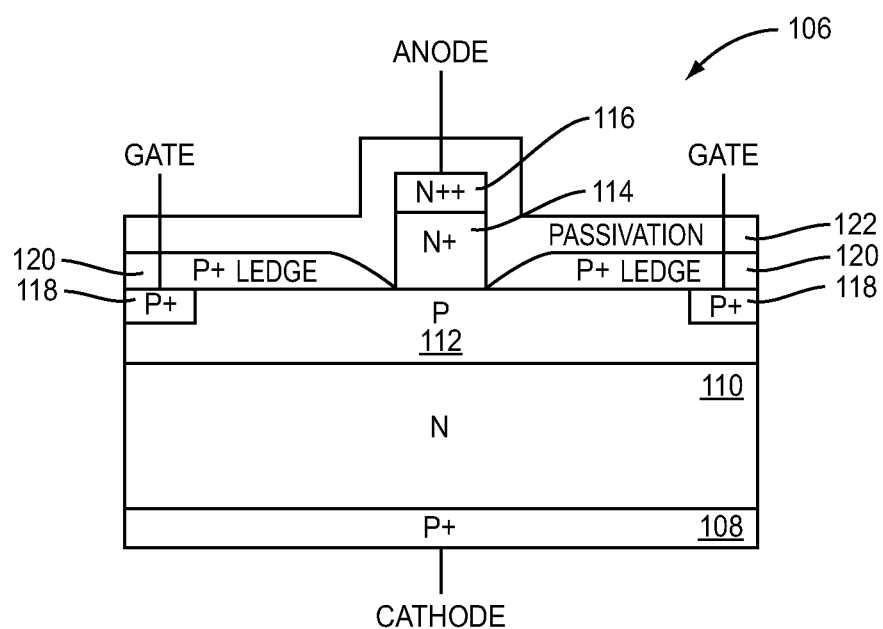

FIG. 5 graphically illustrates formation of a highly doped semiconductor ledge layer on the surface of the base layer of the GTO of FIGS. 4A through 4G via a thermal oxidation process according to one embodiment of the present disclosure; and FIG. 6 illustrates an N-type GTO and a method of fabrication thereof according to the second embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Electronic device structures including semiconductor ledge layers for surface passivation and methods of manufacturing the same are disclosed. In general, electronic device structures are provided for a PN junction based electronic device. For the discussion below, the PN junction based electronic device is primarily a Gate Turn-Off Thyristor (GTO). However, the inventive concepts disclosed herein are not limited thereto. The inventive concepts disclosed herein are equally applicable to other types of PN junction based electronic devices such as, for example, Bipolar Junction Transistors (BJTs), MOS-Controlled Thyristors (MCTs), or the like.

Figure 2A:
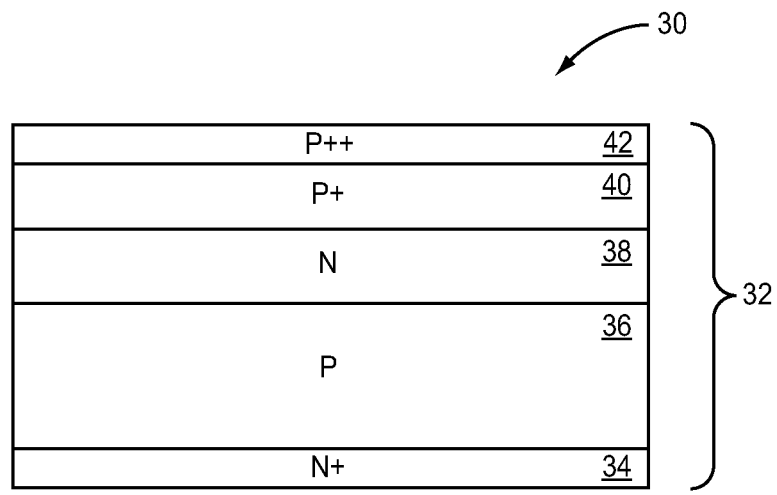
FIGS. 2A through 2E illustrate a P-type GTO and a method of fabrication thereof according to a first embodiment of the present disclosure.

FIGS. 2A through 2E illustrate a GTO 30 and a process for fabricating the GTO 30 according to one embodiment of the present disclosure. As illustrated in FIG. 2A, fabrication of the GTO 30 begins with a structure 32 including a number of semiconductor layers 34 through 42 of a desired semiconductor material having alternating doping types. In the preferred embodiment, the semiconductor layers 34 through 42 are epitaxially grown layers of Silicon Carbide (SiC). However, the present disclosure is not limited thereto. Other semiconductor materials may be used as will be appreciated by one of ordinary skill in the art upon reading this disclosure. The structure 32 includes an N-type semiconductor layer 34 that is highly doped, a P-type semiconductor layer 36 on the N-type semiconductor layer 34, an N-type base layer 38 epitaxially grown on the P-type epitaxial layer 36, a P-type semiconductor layer 40 that is highly doped and on the N-type base layer 38, and a P-type semiconductor layer 42 that is very highly doped and on the P-type semiconductor layer 40. The P-type semiconductor layers 40 and 42 may also be referred to herein as contact layers. Note that, while not illustrated, one of ordinary skill in the art will readily appreciate that one or more of the semiconductor layers 34 through 42 may include sub-layers. For example, the P-type semiconductor layer 36 may include a P-type sub-layer (e.g., an isolation layer) on the N-type semiconductor layer 34 and a lightly doped P-type sub-layer (e.g., a drift layer) on the P-type sub-layer. As used herein, unless otherwise stated, a highly doped semiconductor layer has a doping level of greater than or equal to about $1 \times 10^{18}$ carriers (i.e., electrons or holes) per centimeter cubed (cm$^3$), a very highly doped semiconductor layer has a doping level in a range of about and including $5 \times 10^{18}$ to $2 \times 10^{20}$ carriers per cm$^3$, and a lightly doped semiconductor layer has a doping level of less than or equal to about $1 \times 10^{17}$ carriers per cm$^3$.

Figure 2B:
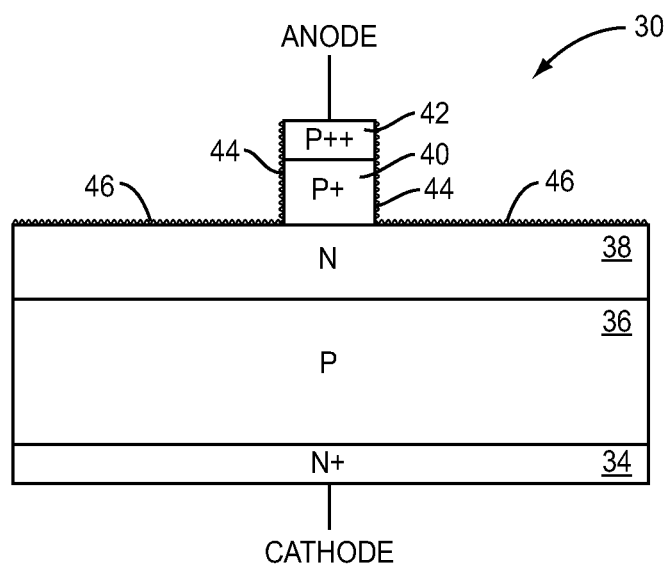
Figure 2C:
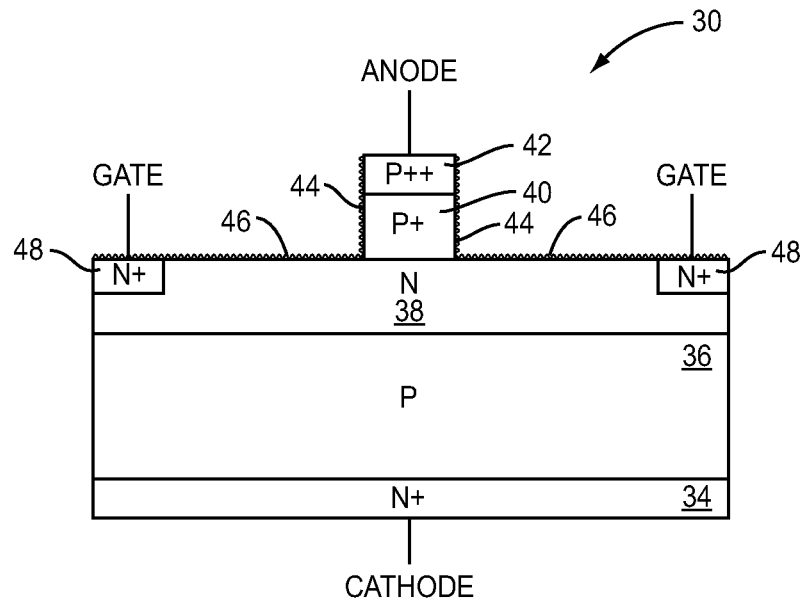
Figure 2D:
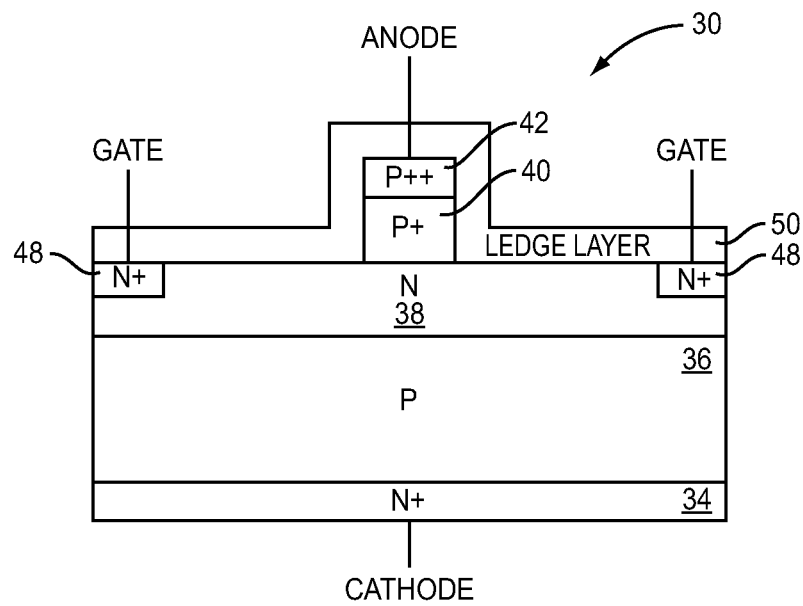

As illustrated in FIG. 2B, the P-type semiconductor layers 40 and 42 are etched down to the N-type base layer 38 such that, after etching, the P-type semiconductor layers 40 and 42 form an anode of the GTO 30. In one embodiment, the P-type semiconductor layers 40 and 42 are etched via Reactive Ion Etching (RIE). The N-type semiconductor layer 34 forms a cathode of the GTO 30. As illustrated, as a result of the etching process, there is substantial damage to the crystalline structure both at sidewall surfaces 44 of the P-type semiconductor layers 40 and 42 forming the anode of the GTO 30 and at a surface 46 of the N-type base layer 38. Next, as illustrated in FIG. 2C, N+ wells 48 are formed in the N-type base layer 38 via ion implantation as illustrated, where the N+ wells 48 form gates of the GTO 30. Note that while the GTO 30 of this embodiment includes two N+ wells 48 and thus two gates, the GTO 30 may alternatively include only one N+ well 48 and one gate. It should also be noted that the anode, cathode, and gate(s) of the GTO 30 may more generally be referred to herein as contact regions.

In this embodiment, in order to mitigate or eliminate interface charge, or surface traps, resulting from the damage to the crystalline structure at the sidewall surfaces 44 of the P-type semiconductor layers 40 and 42 forming the anode of the GTO 30 and the surface 46 of the N-type base layer 38, a semiconductor ledge layer 50 is epitaxially grown over the surface 46 of the N-type base layer 38 and the sidewall surfaces 44 of the P-type semiconductor layers 40 and 42 forming the anode of the GTO 30. In this embodiment, the semiconductor ledge layer 50 is formed of the same material as the semiconductor layers 34 though 42 and is either lightly doped N-type (N−) or lightly doped P-type (P−). In one embodiment, both the semiconductor layers 34 through 42 and the semiconductor ledge layer 50 are formed of SiC. Because the semiconductor ledge layer 50 is lightly doped, the semiconductor ledge layer 50 has a high resistivity, which prevents shorting of the anode of the GTO 30 to the gate(s) of the GTO 30. Further, because the semiconductor ledge layer 50 is epitaxially grown, the semiconductor ledge layer 50 is a high quality material layer that provides improved passivation of the surfaces 44 and 46 as compared to traditional passivation layers such as layers of Silicon Dioxide ($SiO_2$) and Silicon Nitride (SiN). In addition, during epitaxial growth of the semiconductor ledge layer 50, which may also be referred to herein as a regrowth process, the GTO 30 may be heated as part of the regrowth process such that some of the damaged material on the surfaces 44 and 46 is removed via evaporation, thereby improving the quality of the surfaces 44 and 46 and reducing the interface charge at the surfaces 44 and 46. As a result of the passivation provided by the semiconductor ledge layer 50, interface charge at the surfaces 44 and 46 is reduced, thereby increasing the gain (β) of the top transistor of the GTO 30, which in turn decreases the turn-on current ($I_{G,TURN-ON}$) of the GTO 30.

Preferably, the doping level and thickness of the semiconductor ledge layer 50 are optimized to compensate for the amount of interface charge at the surfaces 44 and 46. More specifically, a charge ($Q_{LEDGE}$) of the semiconductor ledge layer 50 may be defined as:

$$Q_{LEDGE} = q \cdot t_{LEDGE} \cdot N_{LEDGE},$$

where q is a magnitude of the electronic charge of one electron/hole, $t_{LEDGE}$ is the thickness of the semiconductor ledge layer 50, and $N_{LEDGE}$ is the doping level of the semiconductor ledge layer 50. The thickness ($t_{LEDGE}$) of the semiconductor ledge layer 50 and the doping level ($N_{LEDGE}$) of the semiconductor ledge layer 50 may then be optimized such that:

$$Q_{LEDGE} = q \cdot t_{LEDGE} \cdot N_{LEDGE} \approx Q_{INTERFACE},$$

where $Q_{INTERFACE}$ is the interface charge. The interface charge ($Q_{INTERFACE}$) may be determined using any suitable technique such as, for example, simulation or experimentation. In one embodiment, the doping level ($N_{LEDGE}$) of the semiconductor ledge layer 50 is in the range of about and including $5 \times 10^{15}$ to $1 \times 10^{17}$ carriers per $cm^3$, and the thickness ($t_{LEDGE}$) of the semiconductor ledge layer 50 is in the range of about and including 1000 to 3000 Angstroms. In contrast, in one embodiment, the N-type base layer 38 has a doping level in the range of about and including $1 \times 10^{17}$ to $1 \times 10^{18}$ electrons per $cm^3$ and a thickness in the range of about and including 0.5 to 5 micrometers. Note, however, that the thickness of the N-type base layer 38 is inversely related to the thickness. For example, the N-type base layer 38 may have a thickness of 5 micrometers for a doping level of $1 \times 10^{17}$ electrons per $cm^3$ or a thickness of 0.5 micrometers for a doping level of $1 \times 10^{18}$ electrons per $cm^3$.

Figure 2E:
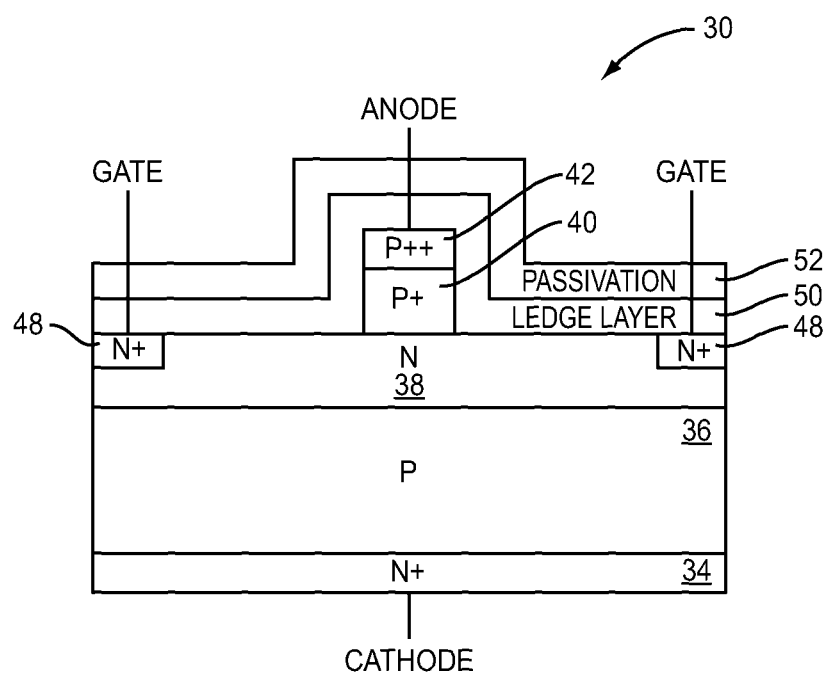

Optionally, as illustrated in FIG. 2E, a passivation layer 52 may be formed over the semiconductor ledge layer 50. The passivation layer 52 may be formed of, for example, $SiO_2$, SiN, or other suitable material. It should be noted that while the semiconductor ledge layer 50 of FIGS. 2D and 2E covers both the sidewall surfaces 44 of the P-type semiconductor layers 40 and 42 and the surface 46 of the N-type base layer 38, the present disclosure is not limited thereto. In another embodiment, the semiconductor ledge layer 50 may be fabricated such that the semiconductor ledge layer 50 covers the surface 46 of the N-type base layer 38 but not the sidewall surfaces 44 of the P-type semiconductor layers 40 and 42 forming the anode of the GTO 30. In this case, the passivation layer 52 may cover the semiconductor ledge layer 50 and the exposed surfaces of the P-type semiconductor layers 40 and 42.

Figure 3:
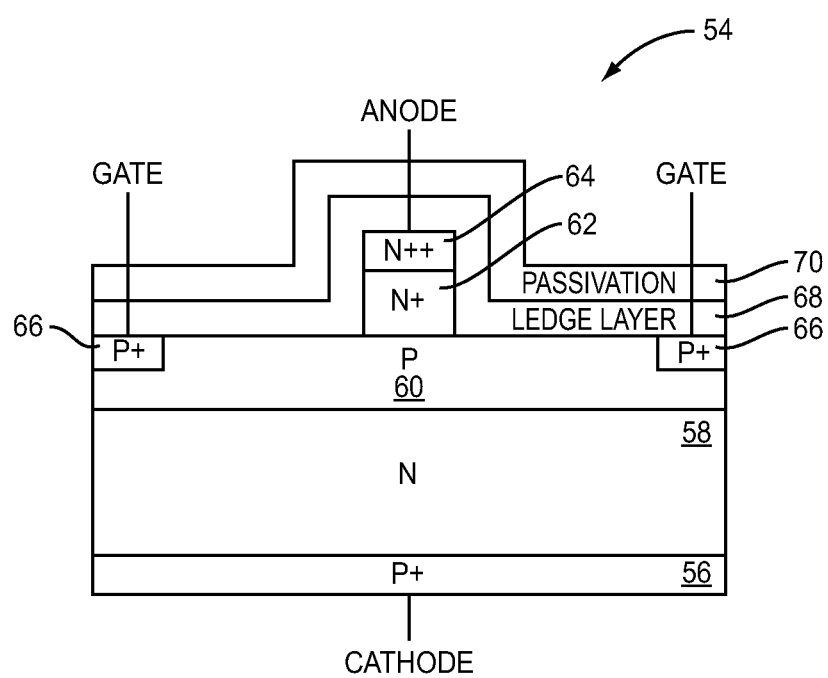
FIG. 3 illustrates an N-type GTO and method of fabrication thereof according to the first embodiment of the present disclosure.

While the GTO 30 of FIGS. 2A through 2E is a P-type GTO, the same concepts may be applied to an N-type GTO 54, as illustrated in FIG. 3. As illustrated, the GTO 54 includes a number of semiconductor layers 56 through 64 of a desired semiconductor material having alternating doping types. In the preferred embodiment, the semiconductor layers 56 through 64 are epitaxially grown layers of SiC. However, the present disclosure is not limited thereto. Other semiconductor materials may be used as will be appreciated by one of ordinary skill in the art upon reading this disclosure. The semiconductor layers 56 through 64 include a P-type semiconductor layer 56 that is highly doped and serves as a cathode for the GTO 54, an N-type semiconductor layer 58 on the P-type semiconductor layer 56, an P-type base layer 60 epitaxially grown on the N-type semiconductor layer 58, an N-type semiconductor layer 62 that is highly doped and on the P-type base layer 60, and an N-type semiconductor layer 64 that is very highly doped and on the N-type semiconductor layer 62. Again, note that, while not illustrated, one of ordinary skill in the art will readily appreciate that one or more of the semiconductor layers 56 through 64 may include sub-layers. For example, the N-type semiconductor layer 58 may include an N-type sub-layer (e.g., an isolation layer) on the P-type semiconductor layer 56 and a lightly doped N-type sub-layer (e.g., a drift layer) on the N-type sub-layer.

The N-type semiconductor layers 62 and 64 are etched down to the P-type base layer 60 such that, after etching, the N-type semiconductor layers 62 and 64 form an anode of the GTO 54. In one embodiment, the N-type semiconductor layers 62 and 64 are etched via RIE. As a result of the etching process, there is substantial damage to the crystalline structure both at sidewall surfaces of the N-type semiconductor layers 62 and 64 forming the anode of the GTO 54 and at a surface of the P-type base layer 60. P+ wells 66 are formed in the P-type base layer 60 as illustrated, where the P+ wells 66 form gates of the GTO 54. Again, note that while the GTO 54 of this embodiment includes two P+ wells 66 and thus two gates, the GTO 54 may alternatively include only one P+ well 66 and one gate. It should also be noted that the anode, cathode, and gate(s) of the GTO 54 may more generally be referred to herein as contact regions.

In this embodiment, in order to mitigate or eliminate interface charge, or surface traps, resulting from the damage to the crystalline structure at the sidewall surfaces of the N-type semiconductor layers 62 and 64 forming the anode of the GTO 54 and the surface of the P-type base layer 60, a semiconductor ledge layer 68 is epitaxially grown over the surface of the P-type base layer 60 and the sidewall surfaces of the N-type semiconductor layers 62 and 64 forming the anode of the GTO 54. In this embodiment, the semiconductor ledge layer 68 is formed of the same material as the semiconductor layers 56 though 64 and is either lightly doped N-type (N−) or lightly doped P-type (P−). In one embodiment, both the semiconductor layers 56 through 64 and the semiconductor ledge layer 68 are formed of SiC. Because the semiconductor ledge layer 68 is lightly doped, the semiconductor ledge layer 68 has a high resistivity, which prevents shorting of the anode of the GTO 54 to the gate(s) of the GTO 54. Further, because the semiconductor ledge layer 68 is epitaxially grown, the semiconductor ledge layer 68 is a high quality material layer that provides improved passivation of the sidewall surfaces of the N-type semiconductor layers 62 and 64 forming the anode of the GTO 54 and the surface of the P-type base layer 60 as compared to traditional passivation layers such as layers of $SiO_2$ and SiN. In addition, during epitaxial growth of the semiconductor ledge layer 68, which may also be referred to herein as a regrowth process, the GTO 54 may be heated as part of the regrowth process such that some of the damaged material on the sidewall surfaces of the N-type semiconductor layers 62 and 64 forming the anode of the GTO 54 and the surface of the P-type base layer 60 is removed via evaporation. As a result, interface charge, or the number of surface traps, is reduced. As a result of the passivation provided by the semiconductor ledge layer 68, the gain (β) of the top transistor of the GTO 54 is increased, which in turn decreases the turn-on current ($I_{G,TURN-ON}$) of the GTO 54.

Preferably, the doping level and thickness of the semiconductor ledge layer 68 are optimized to compensate for the amount of interface charge at the sidewall surfaces of the N-type semiconductor layers 62 and 64 forming the anode of the GTO 54 and the surface of the P-type base layer 60. More specifically, a charge ($Q_{LEDGE}$) of the semiconductor ledge layer 68 may be defined as:

$$Q_{LEDGE} = q \cdot t_{LEDGE} \cdot N_{LEDGE},$$

where q is a magnitude of the electronic charge of one electron/hole, $t_{LEDGE}$ is the thickness of the semiconductor ledge layer 68, and $N_{LEDGE}$ is the doping level of the semiconductor ledge layer 68. The thickness ($t_{LEDGE}$) of the semiconductor ledge layer 68 and the doping level ($N_{LEDGE}$) of the semiconductor ledge layer 68 may then be optimized such that:

$$Q_{LEDGE} = q \cdot t_{LEDGE} \cdot N_{LEDGE} \approx Q_{INTERFACE},$$

where $Q_{INTERFACE}$ is the interface charge. The interface charge ($Q_{INTERFACE}$) may be determined using any suitable technique such as, for example, simulation or experimentation. In one embodiment, the doping level ($N_{LEDGE}$) of the semiconductor ledge layer 68 is in the range of about and including $5 \times 10^{15}$ to $1 \times 10^{17}$ carriers per $cm^3$, and the thickness ($t_{LEDGE}$) of the semiconductor ledge layer 68 is in the range of about and including 1000 to 3000 Angstroms. In contrast, in one embodiment, the P-type base layer 60 has a doping level in the range of about and including $1 \times 10^{17}$ to $1 \times 10^{18}$ holes per $cm^3$ and a thickness in the range of about and including 0.5 to 5 micrometers.

Optionally, as illustrated, a passivation layer 70 may be formed over the semiconductor ledge layer 68. The passivation layer 70 may be formed of, for example, $SiO_2$, SiN, or other suitable material. It should be noted that while the semiconductor ledge layer 68 of FIG. 3 covers both the sidewall surfaces of the N-type semiconductor layers 62 and 64 and the surface of the P-type base layer 60, the present disclosure is not limited thereto. In another embodiment, the semiconductor ledge layer 68 may be fabricated such that the semiconductor ledge layer 68 covers the surface of the P-type base layer 60 but not the sidewall surfaces of the N-type semiconductor layers 62 and 64 forming the anode of the GTO 54. In this case, the passivation layer 70 may cover the semiconductor ledge layer 68 and the exposed surfaces of the N-type semiconductor layers 62 and 64.

FIGS. 4A through 4G illustrate a GTO 72 and a process for fabricating the GTO 72 according to another embodiment of the present disclosure. As illustrated in FIG. 4A, fabrication of the GTO 72 begins with a structure 74 including a number of semiconductor layers 76 through 84 of a desired semiconductor material having alternating doping types. The structure 74 includes an N-type semiconductor layer 76 that is highly doped, a P-type semiconductor layer 78 on the N-type semiconductor layer 76, an N-type base layer 80 epitaxially grown on the P-type semiconductor layer 78, a P-type semiconductor layer 82 that is highly doped and on the N-type base layer 80, and a P-type semiconductor layer 84 that is very highly doped and on the P-type semiconductor layer 82. In this embodiment, the semiconductor layers 76 through 84 are epitaxially grown layers of SiC. However, the present disclosure is not limited thereto. As discussed below, as will be appreciated by one of ordinary skill in the art upon reading this disclosure, other semiconductor materials having a thermal oxidation rate on a plane corresponding to the sidewall surfaces of the anode that is greater than a thermal oxidation rate on a plane corresponding to the surface of the N-type base layer 80 may be used. Note that, while not illustrated, one of ordinary skill in the art will readily appreciate that one or more of the semiconductor layers 76 through 84 may include sub-layers. For example, the P-type semiconductor layer 78 may include a P-type sub-layer (e.g., an isolation layer) on the N-type semiconductor layer 76 and a lightly doped P-type sub-layer (e.g., a drift layer) on the P-type sub-layer. Again, as used herein, unless otherwise stated, a highly doped semiconductor layer has a doping level of greater than or equal to about $1 \times 10^{18}$ carriers per $cm^3$, a very highly doped semiconductor layer has a doping level in a range of about and including $5 \times 10^{18}$ to $2 \times 10^{20}$ carriers per $cm^3$, and a lightly doped semiconductor layer has a doping level of less than or equal to about $1 \times 10^{17}$ carriers per $cm^3$.

As illustrated in FIG. 4B, the P-type semiconductor layers 82 and 84 are etched down to the N-type base layer 80 such that, after etching, the P-type semiconductor layers 82 and 84 form an anode of the GTO 72. In one embodiment, the P-type semiconductor layers 82 and 84 are etched via RIE. The N-type semiconductor layer 76 forms a cathode of the GTO 72. As illustrated, as a result of the etching process, there is substantial damage to the crystalline structure both at sidewall surfaces 86 of the P-type semiconductor layers 82 and 84 forming the anode of the GTO 72 and at a surface 88 of the N-type base layer 80. Next, as illustrated in FIG. 4C, N+ wells 90 are formed in the N-type base layer 80 via ion implantation as illustrated, where the N+ wells 90 form gates of the GTO 72. Note that while the GTO 72 of this embodiment includes two N+ wells 90 and thus two gates, the GTO 72 may alternatively include only one N+ well 90 and one gate. It should also be noted that the anode, cathode, and gate(s) of the GTO 72 may more generally be referred to herein as contact regions.

Figure 1A:
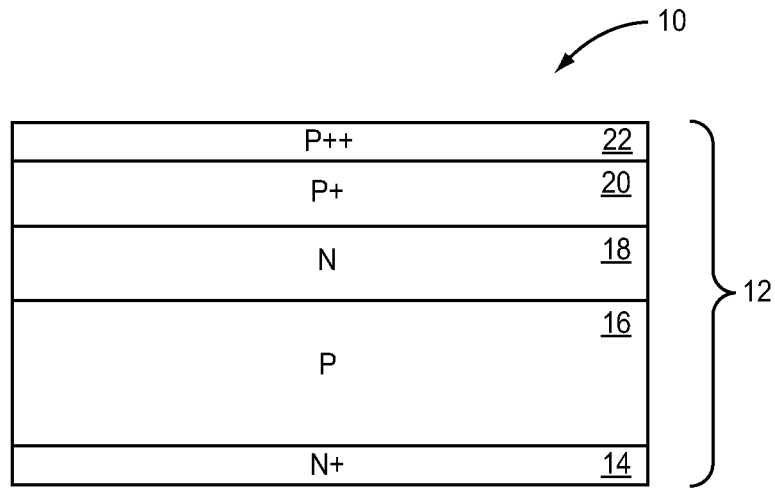
FIGS. 1A through 1C illustrate a Gate Turn-On Thyristor (GTO) and a method of fabrication thereof according to the prior art.
Figure 1B:
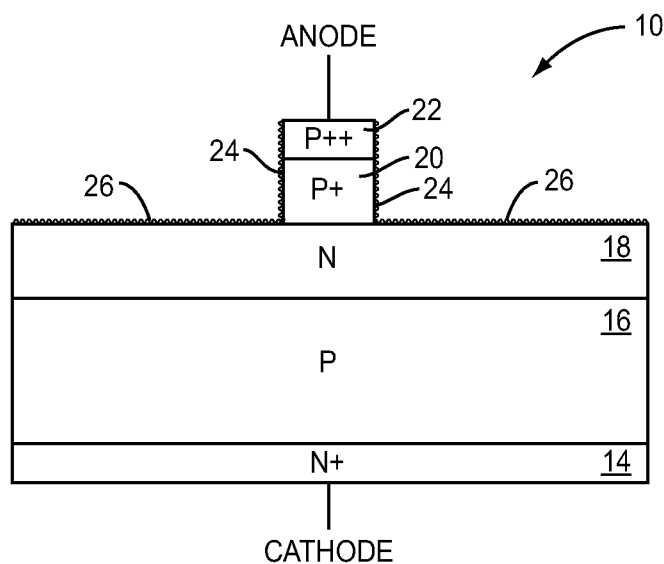
Figure 1C:
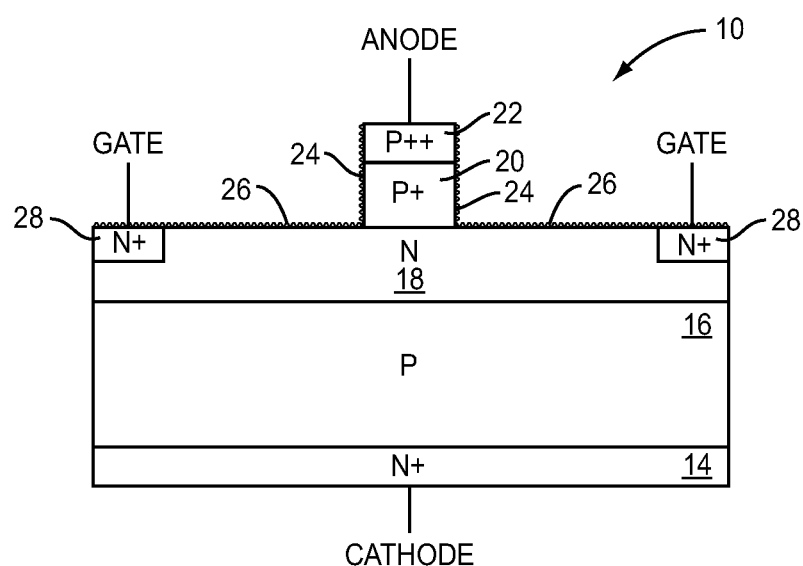

In this embodiment, in order to mitigate or eliminate interface charge, or surface traps, a highly doped semiconductor ledge layer of the same doping type as the N-type base layer 80 is formed on the surface 88 of the N-type base layer 80. As discussed below in detail, the highly doped semiconductor ledge layer creates a doping gradient between the highly doped semiconductor ledge layer and the N-type base layer 80. This doping gradient creates an electric field that operates to repel electrons injected into the N-type base layer 80 away from the interface charge, or surface traps, on the surface 88 of the N-type base layer 80. As a result, the gain (β) of the top transistor of the GTO 72 is substantially increased as compared to that of the traditional GTO 10 (FIGS. 1A through 1C), which in turn decreases the turn on current ($I_{G,TURN-ON}$) of the GTO 72.

In order to fabricate the highly doped semiconductor ledge layer, in this embodiment, a highly doped N-type layer 92 is epitaxially grown over the surface 88 of the N-type base layer 80 and the sidewall surfaces 86 of the P-type semiconductor layers 82 and 84 forming the anode of the GTO 72 as illustrated in FIG. 4D. The highly doped N-type layer 92 is formed of the same material as the semiconductor layers 76 through 84. Thus, in this embodiment, both the semiconductor layers 76 through 84 and the highly doped N-type layer 92 are formed of SiC. The doping level of the highly doped N-type layer 92 is preferably greater than or equal to about $1\times10^{18}$ electrons per $cm^3$. Next, a thermal oxidation process is performed to remove a portion of the highly doped N-type layer 92 on the sidewall surfaces 86 of the P-type semiconductor layers 82 and 84 forming the anode of the GTO 72. The thermal oxidation process may be performed by placing the GTO 72 in an oven or furnace at a predetermined temperature such as, for example 1100° C. for a predetermined amount of time such as, for example, one hour.

More specifically, SiC is formed of alternating layers of Silicon (Si) atoms and Carbon (C) atoms. In this embodiment, the surface 88 of the N-type base layer 80 is a layer of Silicon (Si) atoms and is referred to herein as an Si-face of the SiC. In contrast, the sidewall surfaces 86 of the P-type semiconductor layers 82 and 84 forming the anode of the GTO 72 are alternating Silicon (Si) and Carbon (C) atoms and are referred to herein as A-faces of the SiC. A thermal oxidation rate of the A-face of the SiC is greater than or equal to about four times a thermal oxidation rate of the Si-face of the SiC. This difference in thermal oxidation rates between the A-face and the Si-face of the SiC is exploited to remove the portion of the highly doped N-type layer 92 that is on the sidewall surfaces 86 of the P-type semiconductor layers 82 and 84 forming the anode of the GTO 72.

Even more specifically, as illustrated in FIG. 4E, the thermal oxidation process is performed until an oxide 94 having a thickness that is approximately twice a thickness of the highly doped N-type layer 92 prior to the thermal oxidation process is formed on the sidewall surfaces 86 of the P-type semiconductor layers 82 and 84 forming the anode of the GTO 72. Approximately half the thickness of the oxide 94 is sacrificed SiC 96. As such, since the thickness of the oxide 94 is approximately twice the thickness of the highly doped N-type layer 92, the sacrificed SiC 96 is the portion of the highly doped N-type layer 92 on the sidewall surfaces 86 of the P-type semiconductor layers 82 and 84 forming the anode of the GTO 72. However, since the thermal oxidation rate of the Si-face is less than or equal to about $\frac{1}{4}^{th}$ of the thermal oxidation rate on the A-face, an oxide 98 formed on the surface of the portion of the highly doped N-type layer 92 on the surface of the N-type base layer 80 is approximately equal to or less than $\frac{1}{4}^{th}$ of the thickness of the oxide 94 formed on the sidewall surfaces 86 of the P-type semiconductor layers 82 and 84 forming the anode of the GTO 72. Again, approximately half of the thickness of the oxide 98 is sacrificed SiC 100. However, in this case, a thickness of the sacrificed SiC 100 is only about $\frac{1}{4}^{th}$ or less of a thickness of the highly doped N-type layer 92 on the surface of the N-type base layer 80 prior to performing the thermal oxidation process. As such, the highly doped N-type layer 92 remains on the surface of the N-type base layer 80 after performing the thermal oxidation process, but has a reduced thickness that is $\frac{3}{4}^{ths}$ or more of the thickness of the highly doped N-type layer 92 prior to performing the thermal oxidation process. In a similar manner, oxide is formed on a top surface of the P-type semiconductor layer 84, where forming this oxide sacrifices approximately $\frac{1}{4}^{th}$ or less of a portion of the highly doped N-type layer 92 on the top surface of the P-type semiconductor layer 84.

The thermal oxidation process and the removal of the portion of the highly doped N-type layer 92 on the sidewall surfaces 86 of the P-type semiconductor layers 82 and 84 is illustrated in more detail in FIG. 5. As illustrated in FIG. 5, before performing the thermal oxidation process, the highly doped N-type layer 92 has a thickness ($t_{N+}$). The thermal oxidation process is then performed such that a thickness ($t_{OX,A-FACE}$) of the oxide 94 formed on the sidewall surface 86 of the P-type semiconductor layers 82 and 84 forming the anode of the GTO 72 is equal to, or at least approximately equal to, twice the thickness ($t_{N+}$) of the highly doped N-type layer 92 prior to performing the thermal oxidation process. During the thermal oxidation process, half of the thickness of the resulting oxide is sacrificed SiC. As such, since the thickness ($T_{OX,A-FACE}$) is twice the thickness ($t_{N+}$) of the highly doped N-type layer 92, the highly doped N-type layer 92 on the sidewall surface 86 of the P-type semiconductor layers 82 and 82 is sacrificed to form the oxide 94.

However, since the thermal oxidation rate on the A-face is greater than or equal to about four times the thermal oxidation rate on the Si-face, a thickness ($t_{OX,Si-FACE}$) of the oxide 98 formed on the portion of the highly doped N-type layer 92 on the surface 88 of the N-type base layer 80 is less than or equal to about $\frac{1}{4}^{th}$ the thickness ($t_{OX,A-FACE}$) of the oxide 94 formed on the sidewall surface 86 of the P-type semiconductor layers 82 and 84. As a result, less than or equal to about $\frac{1}{4}^{th}$ of the highly doped N-type layer 92 on the surface 88 of the N-type base layer 80 is sacrificed. The remaining portion of the highly doped N-type layer 92 on the surface 88 of the N-type base layer 80 forms a highly doped semiconductor ledge layer 102 on the surface 88 of the N-type base layer 80.

Next, as illustrated in FIG. 4F, the remaining portion of the highly doped N-type layer 92 on the surface 88 of the N-type base layer 80 forms the highly doped semiconductor ledge layer 102. In one exemplary embodiment, the highly doped semiconductor ledge layer 102 has a thickness that is less than or equal to about 0.5 micrometers. In addition, the oxide 94 on the sidewall surfaces 86 of the P-type semiconductor layers 82 and 84 forming the anode of the GTO 72 and the oxide 98 on the surface of the remaining portion of the highly doped N-type layer 92 on the surface 88 of the N-type base layer 80 may then be removed. In this embodiment, the remaining portion of the highly doped N-type layer 92 on the top surface of the P-type semiconductor layer 84 has also been removed. Optionally, a passivation layer 104 may then be formed over the highly doped semiconductor ledge layer 102 and exposed surfaces of the P-type semiconductor layers 82 and 84 forming the anode of the GTO 72 as illustrated in FIG. 4G. The passivation layer 104 may be formed of, for example, $SiO_2$, SiN, or other suitable material. In an alternative embodiment, rather than forming the passivation layer 104, all or a portion of the oxide 94 and 98 may remain on the GTO 72 as a passivation layer.

As discussed above, the highly doped semiconductor ledge layer 102 creates a doping gradient between the highly doped semiconductor ledge layer 102 and the N-type base layer 80. In one embodiment, the highly doped semiconductor ledge layer 102 has a doping level of greater than about $1\times10^{18}$ electrons per cm$^3$, and the N-type base layer 80 has a doping level in a range of about and including $1\times10^{17}$ to $1\times10^{18}$ electrons per cm$^3$. However, the doping levels of the highly doped semiconductor ledge layer 102 and the N-type base layer 80 are selected such that the doping level of the highly doped semiconductor ledge layer 102 is substantially greater than the doping level of the N-type base layer 80. In one embodiment, the doping gradient is in a range of about and including $1\times10^5$ to $1\times10^8$ cm$^3$ per cm. The doping gradient resulting from the highly doped semiconductor ledge layer 102 and the N-type base layer 80 creates an electric field proportional to the doping gradient that operates to repel electrons injected into the N-type base layer 80 away from the interface charge, or surface traps, on the surface 88 of the N-type base layer 80. As a result, the gain ($\beta$) of the top transistor of the GTO 72 is substantially increased as compared to that of the traditional GTO 10 (FIGS. 1A through 1C), which in turn decreases the turn on current ($I_{G,TURN-ON}$) of the GTO 72 as compared to that of the traditional GTO 10.

While the GTO 72 of FIGS. 4A through 4G is a P-type GTO, the same concepts may be applied to an N-type GTO 106, as illustrated in FIG. 6. As illustrated, the GTO 106 includes a number of semiconductor layers 108 through 116 of a desired semiconductor material having alternating doping types. The semiconductor layers 108 through 116 include a P-type semiconductor layer 108 that is highly doped, an N-type semiconductor layer 110 on the P-type semiconductor layer 108, a P-type base layer 112 epitaxially grown on the N-type semiconductor layer 110, an N-type semiconductor layer 114 that is highly doped and on the P-type base layer 112, and an N-type semiconductor layer 116 that is very highly doped and on the N-type semiconductor layer 114. In this embodiment, the semiconductor layers 108 through 116 are epitaxially grown layers of SiC. However, the present disclosure is not limited thereto. As discussed below, as will be appreciated by one of ordinary skill in the art upon reading this disclosure, other semiconductor materials having a thermal oxidation rate on a plane corresponding to the sidewall surfaces of the anode that is greater than a thermal oxidation rate on a plane corresponding to the surface of the P-type base layer 112 may be used. Note that, while not illustrated, one of ordinary skill in the art will readily appreciate that one or more of the semiconductor layers 108 through 116 may include sub-layers. For example, the N-type semiconductor layer 110 may include an N-type sub-layer (e.g., an isolation layer) on the P-type semiconductor layer 108 and a lightly doped N-type sub-layer (e.g., a drift layer) on the N-type sub-layer.

The N-type semiconductor layers 114 and 116 are etched down to the P-type base layer 112 such that, after etching, the N-type semiconductor layers 114 and 116 form an anode of the GTO 106. In one embodiment, the N-type semiconductor layers 114 and 116 are etched via RIE. The P-type semiconductor layer 108 forms a cathode of the GTO 106. As a result of the etching process, there is substantial damage to the crystalline structure both at sidewall surfaces of the N-type semiconductor layers 114 and 116 forming the anode of the GTO 106 and at a surface of the P-type base layer 112. P+ wells 118 are formed in the P-type base layer 112 via ion implantation as illustrated, where the P+ wells 118 form gates of the GTO 106. Again, note that while the GTO 106 of this embodiment includes two P+ wells 118 and thus two gates, the GTO 106 may alternatively include only one P+ well 118 and one gate. It should also be noted that the anode, cathode, and gate(s) of the GTO 106 may more generally be referred to herein as contact regions.

In this embodiment, in order to mitigate or eliminate interface charge, or surface traps, a highly doped semiconductor ledge layer 120 of the same doping type as the P-type base layer 112 is formed on the surface of the P-type base layer 112. Preferably, the highly doped semiconductor ledge layer 120 is formed in a manner similar to that described above with respect to the highly doped semiconductor ledge layer 102 (FIGS. 4E, FIG. 4F, and FIG. 5). The highly doped semiconductor ledge layer 120 creates a doping gradient between the highly doped semiconductor ledge layer 120 and the P-type base layer 112. In one embodiment, the highly doped semiconductor ledge layer 120 has a doping level of greater than about $1\times10^{18}$ holes per cm$^3$, and the P-type base layer 112 has a doping level in a range of about and including $1\times10^{17}$ to $1\times10^{18}$ holes per cm$^3$. However, the doping levels of the highly doped semiconductor ledge layer 120 and the P-type base layer 112 are selected such that the doping level of the highly doped semiconductor ledge layer 120 is substantially greater than the doping level of the P-type base layer 112. In one embodiment, the doping gradient is in a range of about and including $1\times10^5$ to $1\times10^8$ cm$^3$ per cm. The doping gradient resulting from the highly doped semiconductor ledge layer 120 and the P-type base layer 112 creates an electric field proportional to the doping gradient that operates to repel holes injected into the P-type base layer 112 away from the interface charge, or surface traps, on the surface of the P-type base layer 112. As a result, the gain ($\beta$) of the top transistor of the GTO 106 is substantially increased as compared to that of the traditional GTO 10 (FIGS. 1A through 1C), which in turn decreases the turn on current ($I_{G,TURN-ON}$) of the GTO 106 as compared to that of the traditional GTO 10. A passivation layer 122 may be formed on the highly doped semiconductor ledge layer 120 and the exposed sidewall surfaces of the N-type semiconductor layers 114 and 116 forming the anode of the GTO 106.

Again, it should be noted that while the discussion herein focuses on the GTOs 30, 54, 72, and 106, the concepts disclosed herein are equally applicable to other types of PN junction based devices such as, for example, BJTs, MCTs, or the like. For example, the structures of FIGS. 2A through 2E, FIG. 3, FIGS. 4A through 4G, and FIG. 6 may easily be altered to form corresponding BJTs by omitting the bottom semiconductor layers 34, 56, 76, and 108, respectively. Then, using the structure of FIG. 2E as an example, the P-type semiconductor layers 40 and 42 may form an emitter of a corresponding PNP BJT, the N+ wells 48 may form a base of the corresponding PNP BJT, and the P-type semiconductor layer 36 may form a collector of the corresponding PNP BJT. In a similar manner, the concepts disclosed herein are also applicable to MCTs.

Those skilled in the art will recognize improvements and modifications to the preferred embodiments of the present disclosure. All such improvements and modifications are considered within the scope of the concepts disclosed herein and the claims that follow.

What is claimed is:
1. An electronic device comprising:
   a structure comprising a plurality of semiconductor layers having alternating doping types, the plurality of semiconductor layers comprising:

a base layer of a first doping type that includes a highly doped well forming a first contact region of the electronic device; and one or more contact layers on the base layer that form a second contact region of the electronic device and that are of a second doping type that is opposite the first doping type; and a semiconductor ledge layer directly on the base layer that passivates interface charge at the surface of the base layer, wherein the semiconductor ledge layer is of the first doping type.

2. The electronic device of claim 1 wherein the semiconductor ledge layer is lightly doped.

3. The electronic device of claim 2 wherein a doping level of the semiconductor ledge layer is in a range of about and including $5 \times 10^{15}$ to $1 \times 10^{17}$ carriers per centimeter cubed ($cm^3$).

4. The electronic device of claim 2 wherein the semiconductor ledge layer is on the base layer between the first contact region and the second contact region and one or more sidewall surfaces of the one or more contact layers adjacent to the surface of the base layer.

5. The electronic device of claim 2 wherein the semiconductor ledge layer is on the base layer between the first contact region and the second contact region.

6. The electronic device of claim 2 wherein a doping level and a thickness of the semiconductor ledge layer are optimized to compensate for the interface charge at the surface of the base layer.

7. The electronic device of claim 6 wherein the doping level of the semiconductor ledge layer is in a range of about and including $5 \times 10^{15}$ to $1 \times 10^{17}$ carriers per centimeter cubed ($cm^3$) and the thickness of the semiconductor ledge layer is in a range of about and including 1000 to 3000 Angstroms.

8. The electronic device of claim 1 wherein the semiconductor ledge layer is a highly doped semiconductor ledge layer on the surface of the base layer.

9. The electronic device of claim 8 wherein the highly doped semiconductor ledge layer has a doping level that is greater than or equal to about $1 \times 10^{18}$ carriers per centimeter cubed ($cm^3$).

10. The electronic device of claim 9 wherein the base layer has a doping level in a range of about and including $1 \times 10^{17}$ to $1 \times 10^{18}$ carriers per $cm^3$.

11. The electronic device of claim 8 wherein a doping level of the highly doped semiconductor ledge layer is greater than a doping level of the base layer such that a doping gradient from the highly doped semiconductor ledge layer to the base layer creates an electric field that repels charge carriers injected into the base layer away from the interface charge at the surface of the base layer.

12. The electronic device of claim 11 wherein the doping gradient is in a range of about and including $1 \times 10^{5}$ to $1 \times 10^{8}$ centimeters cubed ($cm^3$) per cm.

13. The electronic device of claim 1 wherein the plurality of semiconductor layers further comprise one or more semiconductor layers on which the base layer is formed, and a bottom surface of the one or more semiconductor layers forms a third contact region of the electronic device.

14. The electronic device of claim 13 wherein the electronic device is a Gate Turn-Off Thyristor (GTO), and the first contact region is a gate of the GTO, the second contact region is an anode of the GTO, and the third contact region is a cathode of the GTO.

15. The electronic device of claim 13 wherein the electronic device is a Bipolar Junction Transistor (BJT), and the first contact region is a base of the BJT, the second contact region is an emitter of the BJT, and the third contact region is a collector of the BJT.

16. The electronic device of claim 1 wherein the electronic device is a MOS-Controlled Thyristor (MCT).

17. The electronic device of claim 1 wherein the interface charge is caused by crystalline damage on at least the surface of the base layer resulting from the etching of the one or more contact layers to form the second contact region.

18. The electronic device of claim 1 wherein the plurality of semiconductor layers and the semiconductor ledge layer are formed of Silicon Carbide (SiC).

19. The electronic device of claim 1 wherein the plurality of semiconductor layers and the semiconductor ledge layer are epitaxially grown semiconductor layers.

* * * * *